United States Patent
Lee

(10) Patent No.: US 7,538,486 B2
(45) Date of Patent: May 26, 2009

(54) LIGHT EMITTING DISPLAY PANEL HAVING A STRUCTURE TO PREVENT DAMAGE TO CONDUCTIVE LINES

(75) Inventor: Il Ho Lee, Daejeon (KR)

(73) Assignee: LG Display Co., Ltd., Seoul (KR)

( * ) Notice: Subject to any disclaimer, the term of this patent is extended or adjusted under 35 U.S.C. 154(b) by 211 days.

(21) Appl. No.: 11/316,734

(22) Filed: Dec. 27, 2005

(65) Prior Publication Data
US 2006/0232197 A1 Oct. 19, 2006

(30) Foreign Application Priority Data
Apr. 18, 2005 (KR) .................... 10-2005-0032061

(51) Int. Cl.
*H01J 1/62* (2006.01)
*H01J 63/04* (2006.01)
*G09G 3/30* (2006.01)

(52) U.S. Cl. .................... 313/504; 313/505; 345/76

(58) Field of Classification Search ......... 313/502–507
See application file for complete search history.

(56) References Cited

U.S. PATENT DOCUMENTS

| | | | |
|---|---|---|---|
| 6,380,672 B1 * | 4/2002 | Yudasaka | 313/504 |
| 2002/0000773 A1 * | 1/2002 | Kanno et al. | 313/504 |
| 2002/0140343 A1 * | 10/2002 | Hirabayashi | 313/493 |
| 2003/0142043 A1 * | 7/2003 | Matsueda | 345/30 |
| 2004/0046498 A1 * | 3/2004 | Aoki et al. | 313/506 |
| 2004/0048543 A1 * | 3/2004 | Kanno et al. | 445/24 |
| 2004/0056826 A1 * | 3/2004 | Ueda et al. | 345/60 |
| 2004/0095296 A1 * | 5/2004 | Kojima et al. | 345/60 |
| 2004/0185604 A1 * | 9/2004 | Park et al. | 438/149 |
| 2004/0206987 A1 * | 10/2004 | Tsujimura et al. | 257/225 |
| 2004/0217926 A1 * | 11/2004 | Kato | 345/76 |
| 2004/0252088 A1 * | 12/2004 | Kawachi et al. | 345/76 |
| 2004/0263056 A1 * | 12/2004 | Seo et al. | 313/500 |
| 2004/0263740 A1 * | 12/2004 | Sakakura et al. | 349/138 |

* cited by examiner

*Primary Examiner*—Sikha Roy
*Assistant Examiner*—Tracie Y Green
(74) *Attorney, Agent, or Firm*—Birch, Stewart, Kolasch & Birch, LLP

(57) ABSTRACT

A structure to prevent lines of the device from being damaged or scratched by outside objects or to prevent short circuits from occurring is disclosed. The structure may be utilized in light emitting displays such as an organic electroluminescent panel. The structure includes a cell section, data lines, and scan lines. The cell section includes a plurality of pixels formed in luminescent area that are intersection areas of anode electrode layers and cathode electrode layers. The data lines each are connected to the anode electrode layers. The scan lines each are connected to cathode electrode layers. Here, insulating layers are formed to protect a subset of the data lines and/or a subset of the scan lines. Some of the lines are left uncovered so that inspection process may be carried out.

8 Claims, 3 Drawing Sheets

LIGHT EMITTING DISPLAY PANEL HAVING A STRUCTURE TO PREVENT DAMAGE TO CONDUCTIVE LINES

BACKGROUND OF THE INVENTION

1. Field of the Invention

The present invention relates to a light emitting display panel such as an organic electroluminescent panel, and particularly relates to a display panel that includes insulating layers covering side portions as well as top corner portions of a subset of conductive lines outside a cell section of the panel.

2. Description of the Prior Art

An organic electroluminescent panel substrate is a substrate that includes a plurality of panels, each of which displays a predetermined image according to applied voltages.

FIG. 1A is a plane view of a conventional organic electroluminescent panel substrate 100. As shown in FIG. 1A, the organic electroluminescent panel substrate 100 includes a plurality of panels.

FIG. 1B is an enlarged plane view of portion A of FIG. 1, and FIG. 1C is a sectional view of the lines of FIG. 1B as taken along line I-I' of FIG. 1B. In FIG. 1B, the conventional organic electroluminescent panel includes a cell section 104, first scan lines 108, second scan lines 110, a data line connection member 112, a first scan line connection member 114, and a second scan line connection member 116.

The cell section 104 includes a plurality of pixels formed in luminescent areas at intersections of anode electrodes and cathode electrodes.

The data lines 106 are connected to the anode electrode layers of the cell section 104 providing the anode electrode layers with data signals transmitted from an IC chip (not shown). The data line connection member 112 connects the data lines 106 to each other.

The first scan lines 108 are connected to some of the cathode electrode layers of the cell section 104 providing them with first scan signals transmitted from the IC chip. The first scan line connection member 114 connects the first scan lines 108 to each other.

The second scan lines 110 are connected to the remaining cathode electrode layers, providing them with second scan signals transmitted from the IC chip. The second scan line connection member 116 connects the second scan lines 110 to each other.

As illustrated in FIG. 1C, the data lines 106, the first scan lines 108 and the second scan lines 110 are formed from an Indium Tin Oxide (ITO) layer 120 and a metal layer 122 formed from Molybdenum (Mo).

In the conventional organic electroluminescent panel, the data lines 106, the first scan lines 108 and the second scan lines 110, and in particular the metal layers 122 of the lines 106, 108 and 110, are directly exposed to the outside environment. Therefore, during the process of manufacturing the panel, the lines 106, 108 and 110 may be damaged or scratched by outside objects. In addition, short circuits between the lines 160, 108 and 110 may occur.

SUMMARY OF THE INVENTION

An object of the present invention is to provide a light emitting display panel, such as an organic electroluminescent panel, having a structure to prevent the conducting lines of the panel from being damaged or scratched by outside objects.

A light emitting display panel according to an embodiment of the present invention comprises a cell section, data lines, and scan lines. The cell section includes a plurality of pixels formed in luminescent areas at the intersection areas of anode electrode layers and cathode electrode layers. The data lines are connected to the anode electrode layers and the scan lines are connected to the cathode electrode layers. Here, insulating layers can be formed to cover side portions of a subset, less than all, of the data lines and/or side portions of a subset, less than all, of the scan lines. The insulating layers can also be formed to cover top corner portions of some, but not all, of the data/scan lines.

In the light emitting display panel of an embodiment of the present invention, the insulating layers protect the subset of the data/scan lines from damage. Furthermore, as the insulation layers are not formed all lines, sufficient space can be secured for the pins of an inspection equipment so that processes such as defect inspection may be carried out.

BRIEF DESCRIPTION OF THE DRAWINGS

The present invention will be more clearly understood from the detailed description in conjunction with the following drawings.

DETAILED DESCRIPTON OF THE INVENTION

Hereinafter, the embodiments of the present invention will be described in detail with reference to those accompanying drawings.

Figure 1A:
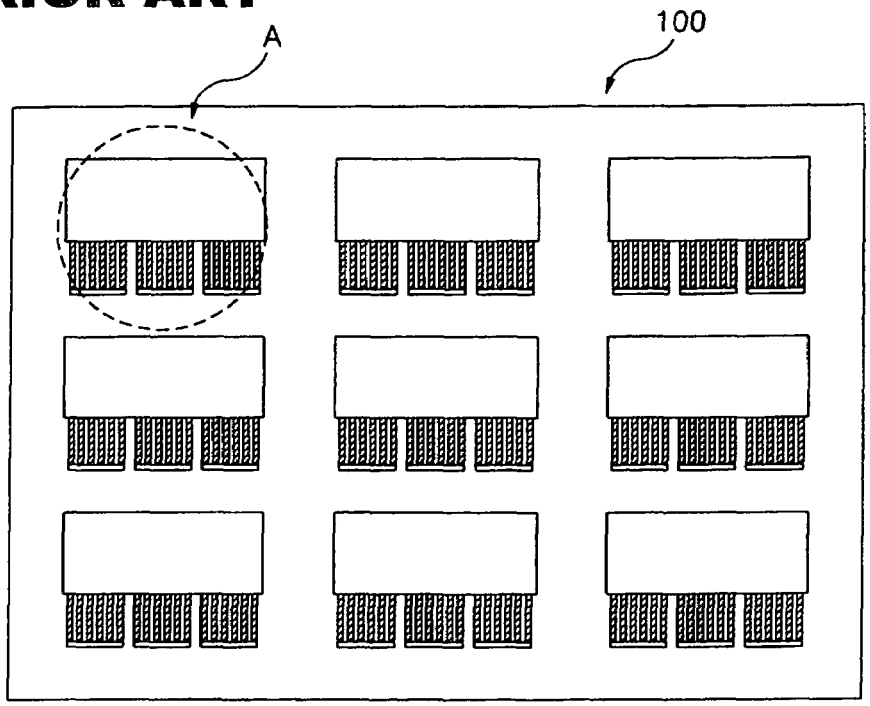
FIG. 1A is a plane view of a conventional organic electroluminescent panel substrate.
Figure 1B:
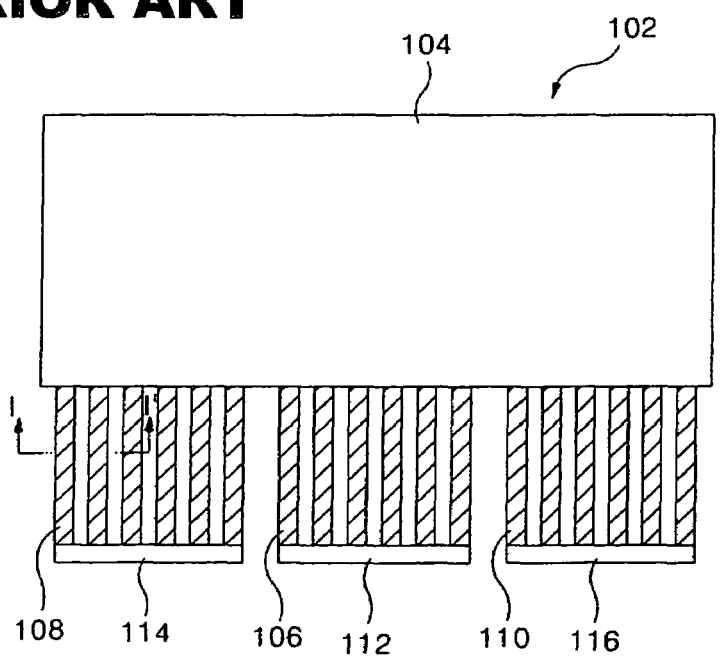
FIG. 1B is an enlarged plane view of portion A of FIG. 1.
Figure 1C:
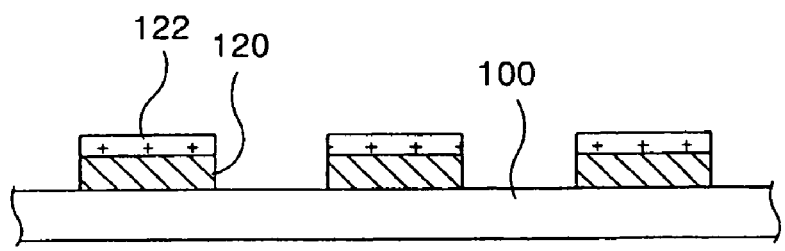
FIG. 1C is a sectional view taken along line I-I' in FIG. 1B.
Figure 2A:
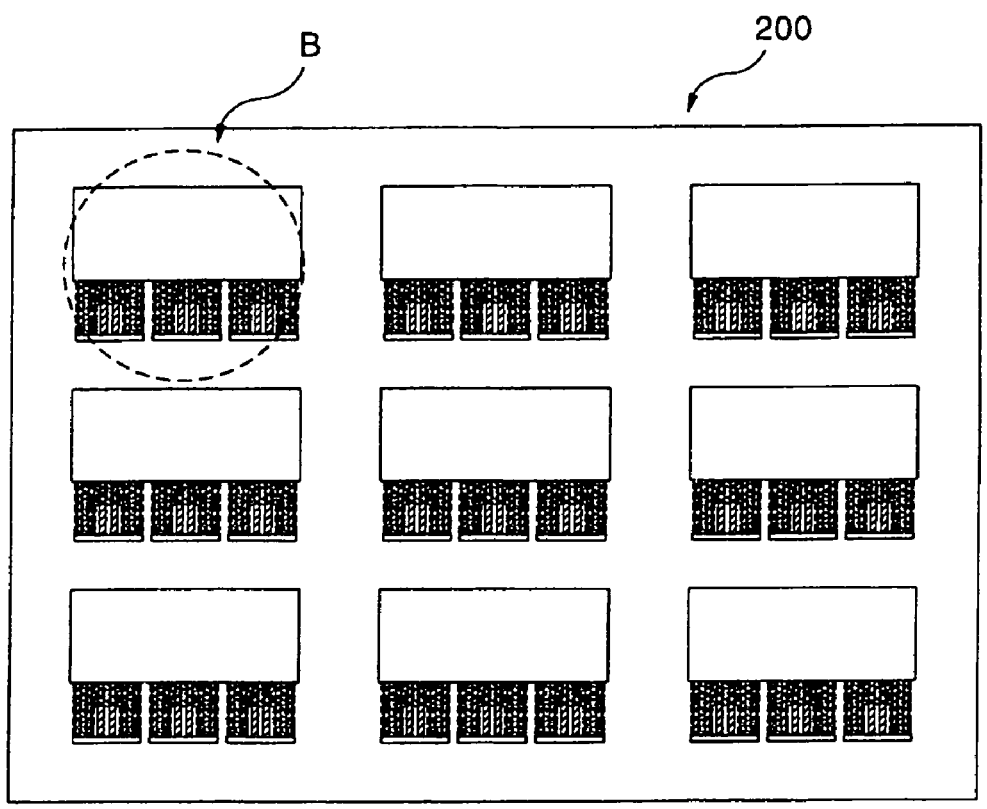
FIG. 2A is a plane view of a light emitting display panel according to an embodiment of the present invention.

FIG. 2A is a plane view of a light emitting display panel according to an embodiment of the present invention. In FIG. 2A, an organic electroluminescent panel is described for explanation purposes. However, the invention is not limited to organic electroluminescent panels. As shown in FIG. 2A, the organic electroluminescent panel substrate 200 includes a plurality of organic electroluminescent panels.

Figure 2B:
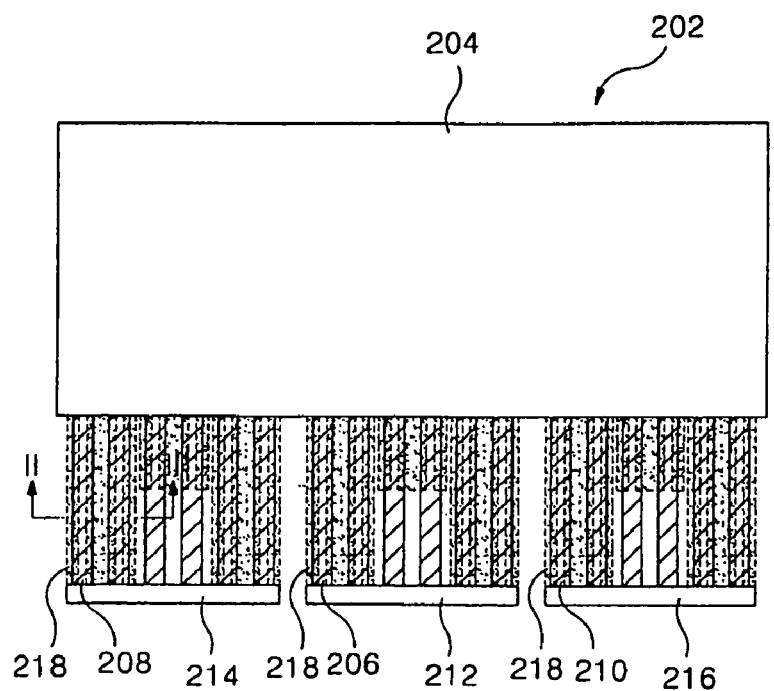
FIG. 2B is an enlarged plane view of the portion B of FIG. 2A.

FIG. 2B is an enlarged plane view of portion B of FIG. 2A. As illustrated in FIG. 2B, the display panel 202 of the present embodiment includes a cell section 204, a plurality of data lines 206, a plurality of first scan lines 208, a plurality of second scan lines 210, a data line connection member 212, a first scan line connection member 214 and a second scan line connection member 216.

The cell section 204 includes a plurality of pixels formed in luminescent areas at intersection areas of anode electrodes and cathode electrodes (not shown). Each pixel includes an anode electrode layer, an organic material layer and a cathode electrode layer, deposited on the substrate 200. The anode electrode layer, the organic material layer and the cathode electrode layer may be deposited in order on the substrate 200. The organic material layer includes hole transporting layer (HTL), emitting layer (EML) and electron transporting layer (ETL).

The plurality of data lines 206 are connected to the corresponding anode electrode layers to provide the anode electrode layers with data signals transmitted from an IC chip (not shown). The data line connection member 212 electrically connects the plurality of data lines 206 to each other.

The first scan lines 208 each are connected to some of the cathode electrodes providing them with first scan signals transmitted from the IC chip. The first scan line connection member 214 electrically connects the first scan lines 208 to each other.

The second scan lines 210 are connected to the remaining cathode electrode layers providing them with second scan signals transmitted from the IC chip. The second scan line connection member 216 electrically connects the second scan lines 210 to each other.

Each connection member 212, 214 and 216 may be a conductor.

While the scan lines are illustrated to be divided into first and second scan lines in FIG. 2B, this is not a requirement. The first and second scan lines may be combined as a single group of scan lines with a single connecting member or may be divided into multiple groups of scan lines (not just two) with a connecting member connecting each group of the scan lines.

Figure 2C:
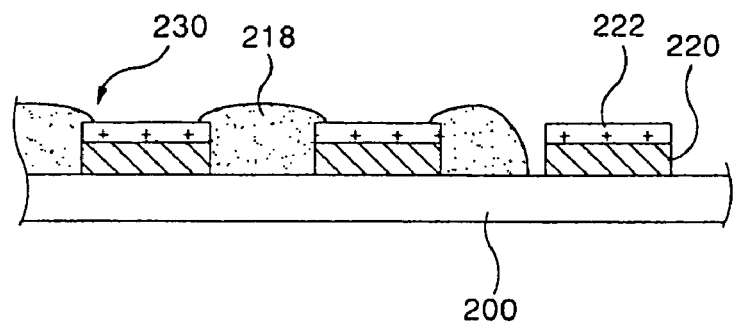
FIG. 2C is a sectional view taken along line II-II' of FIG. 2B to explain an embodiment of the present invention.

FIG. 2C is a sectional view of the panel taken along line II-II' to explain an embodiment of the present invention. In FIG. 2C, insulating layers 218 and conductor lines are illustrated. Each conductor line is formed by a transparent electrode layer 220 disposed on a substrate 200 and a metal layer 222 disposed on the transparent electrode layer 220. The transparent electrode layer 220 may be formed from ITO and the metal layer 222 may be formed from Mo.

While FIG. 2C depicts the transparent electrode layer 220 as being disposed on the substrate 200, i.e. in contact with the substrate 200, this is not a strict requirement. The transparent electrode layer 220 may be disposed "over" the substrate 200 as well. Similarly, the metal layer 222 may be disposed over the transparent electrode layer 220 and the insulating layer 218 may be disposed over the substrate 200.

In FIG. 2C, the insulating layers 218 are deposited between some adjacent conductor lines, but not between all adjacent conductor lines. Where the insulating layer 218 is deposited, the side surfaces of the conductor lines are covered. This protects the covered surfaces of the conductors lines from being scratches. This also minimizes the occurrences of short circuits between adjacent conductor lines. Again, direct contact is not necessary to cover the conductor lines.

The conductor lines illustrated in FIG. 2C represent the first scan lines 208 of FIG. 2B. However, the structure of FIG. 2C are also applicable to the data lines 206 and the second scan lines 210. In other words, the data lines 206 as well as the second scan lines 210 can comprise the transparent electrode layer 220 and the metal layer 222.

Thus, a plurality of insulating layers 218 can be disposed over the substrate 200 in between adjacent data lines of a subset of the data lines 206 such that the side surfaces of the subset of the data lines 206 are covered and thus prevented from exposure. Similarly, the plurality of insulating layers 218 can be disposed over the substrate in between adjacent data lines of a subset of the scan lines 208, 210 such that the side surfaces of the scan lines 208, 210 are covered.

It is preferred that the height of the insulating layer 218 be at least as high as the height of the conductor line, i.e. the height of the data lines and scan lines 206, 208 and 210. This affords protection of the entirety of the side portions of the data and scan lines 206, 208 and 210 against scratches, short circuits, and other types of damage as noted above. For further protection, the insulating layer 218 may be disposed to cover top corner portions 230 of the data and scan lines 206, 208 and 210 as illustrated in FIG. 2C.

It should be noted that even if the top corner portions 230 of the data and scan lines 206, 208 and 210 are covered, at least some portion of the top surfaces remain uncovered. This is to secure sufficient space for bonding the organic electroluminescent panel 202 and COF (Chip On Film) with the IC chip, and to provide the anode electrode layers and the cathode electrode layers with data signals and scan signals transmitted from the IC chip. Preferably, the center portions of the top surface remain uncovered.

The lines 206, 208 and 210 of the organic electroluminescent panel 202 and the electrode section of the COF may be bonded with ACF tape. As a result, the data signals and scan signals are transmitted to the anode electrode layers and the cathode electrode layers through the electrode section and the lines 206, 208 and 210.

However, if the insulating layers 218 are formed on the entire surface of the lines 206, 208 and 210, the data signals and scan signals will be blocked by the insulating layers 218. As a result, the data signals and scan signals will not be transmitted to the anode electrode layers and the cathode electrode layers.

Furthermore, the insulating layers 218 do not attach to the ACF tape well resulting in the bonding strength between the insulating layers 218 and the electrode section being weak. Therefore, it is preferred to form the insulating layers 218 to not cover the entire surfaces of the lines 206, 208 and 210.

As noted above, only a subset of the data lines and/or a subset of the scan lines have the insulating layer 218 disposed in between adjacent lines. In other words, some of the data lines and/or some of the scan lines do not have the insulating layer 218 disposed therebetween.

This is to secure contact areas for the pins of inspection equipment at defect inspection for the organic electroluminescent panel 202, such as lighting inspection, aging inspection, etc. Hereinafter, further detailed description will be exemplified by lighting inspection.

A first pin of the inspection equipment is used to make contact with one of the data lines 206, and then a first voltage—a positive voltage for example—is applied to the contacted data line 206 through the first pin. The first voltage applied through the first pin is provided through the data line connection member 212 to the remaining data lines 206. As a result, the first voltage is applied to the anode electrode layers through all of the data lines 206.

A second pin of the inspection equipment is used to make contact with one of the first scan lines 208, and then a second voltage—a negative voltage for example—is applied to the to the contacted first scan line 208 through the second pin. The second voltage applied through the second pin is provided through the first scan line connection member 214 to the remaining first scan lines 208. As a result, the second voltage is applied to some of the cathode electrode layers through all of the first scan lines 208.

Furthermore, a third pin of the inspection equipment is used to make contact with one of the second scan lines 210, and then a third voltage—another negative voltage for example—is applied to the to the contacted second scan line 210 through the third pin. The third voltage applied through the third pin is provided through the second scan line connection member 216 to the remaining second scan lines 210. As a result, the third voltage is applied to the remaining cathode electrode layers through all of the second scan lines 210.

In short, the inspection equipment detects lighting defect of each pixel by applying the voltages to the anode electrode layers and the cathode electrode layers.

However, if the insulating layers 218 are formed to cover of all the lines 206, 208 and 210, the pins of the inspection equipment may not be able to make contact with the lines 206, 208 and 210 since the widths of the lines 206, 208 and 210 are typically small. For this reason, it is preferred not to have the insulating layers 218 at the edge portion of all lines.

As described above, embodiments of the light emitting display panel of the present invention, for example the organic electroluminescent panel 202, include the insulating layers 218 disposed to cover side portions of a subset of the data lines 206 and/or a subset of the scan lines 208 and 210, thereby preventing the protected lines from being damaged. Furthermore, the insulating layers 218 are not formed for all lines 206, 208 and 210 so that sufficient space can be secured for the pins of the inspection equipment to be contacted with at defect inspection.

In another embodiment of the present invention, scan lines may be formed only in one direction.

Figure 3:
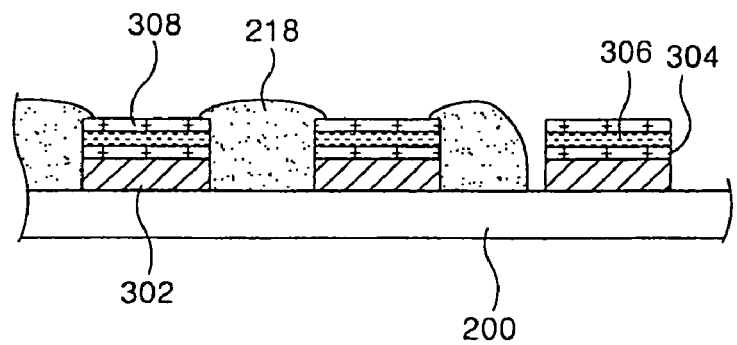
FIG. 3 is a sectional view taken along line II-II' to explain another embodiment of the present invention.

FIG. 3 is a sectional view taken along line II-II' to explain another embodiment of the present invention. In FIG. 3, each conductor line may include a transparent electrode layer 302 and multi-layered metal layers formed over the substrate 200. The conductor lines, i.e. data lines 206 and scan lines 208 and 210, may be formed by depositing a first metal layer 304, a second metal layer 306 and a third metal layer 308 over the transparent electrode layer 302. The metal layers may be deposited in the order specified. The transparent electrode layer 302 can be formed from ITO, the first and third metal layers 304 and 308 can be formed from Mo and the second metal layer 306 can be formed from Al (aluminum).

The first metal layer 304 may inhibit undesirable oxidation due to direct contact between the ITO layer 302 and the second metal layer 306. Furthermore, the third metal electrode layer 308 may inhibit undesirable oxidation of the second metal layer 306. Specifically, in the process of manufacturing the organic electroluminescent panel 202, water may penetrate into the second metal electrode 306. When this occurs, the third metal layer 308 located on the upper side of the second metal layers 306 blocks the water that may penetrate into the second metal layer 306. As a result, the second metal layer 306 does not oxidize.

As described above, as the light emitting display panel of the present invention includes the insulating layers protecting a subset of the conductive lines—data and/or scan lines—from damages such as scratches and short circuits. Additionally, sufficient space can be secured for the pins of the inspection equipment.

Exemplary embodiments of the present invention have been described for illustrative purposes, and those skilled in the art will appreciate that various modifications, additions, and substitutions are possible, without departing from the scope and spirit of the present invention as disclosed in the accompanying claims.

What is claimed is:

1. An organic electroluminescent display panel, comprising:
    a cell area including a plurality of pixels corresponding to a plurality of luminescent areas disposed at a plurality of cross sections located where a plurality of anode electrode layers cross with a plurality of cathode electrode layers;
    a plurality of data lines disposed on a substrate and configured to electrically communicate with a corresponding plurality of anode electrode layers of the cell area to provide data signals thereto;
    a plurality of scan lines disposed on the substrate and configured to electrically communicate with a corresponding plurality of cathode electrode layers of the cell area to provide scan signals thereto; and
    a plurality of insulating layers disposed on the substrate such that
        both ends of a top surface and side surfaces of a subset of the plurality of data lines are each covered by a corresponding insulating layer of the plurality of insulating layers to expose at least a portion of the top surface of the subset of the plurality of data lines, or
        both ends of a top surface and side surfaces of a subset of the plurality of scan lines are each covered by a corresponding insulating layer of the plurality of insulating layers to expose at least a portion of the top surface of the subset of the plurality of scan lines, or both.

2. The display panel of claim 1, wherein
    at least one data line comprises a transparent electrode line disposed on the substrate and a metal line disposed on the transparent electrode line, or
    at least one scan line comprises the transparent electrode line disposed on the substrate and the metal line disposed on the transparent electrode line, or
    both.

3. The display panel of claim 2, wherein the metal line is a first metal line,
    wherein
        the at least one data line further comprises a second metal line disposed on the first metal line and a third metal line disposed on the second metal line, or
        the at least one scan line further comprises the second metal line disposed on the first metal line and the third metal line disposed on the second metal line, or
        both, and
    wherein the second metal line is formed from a material from the first and third metal lines.

4. A light emitting display panel, comprising:
    a plurality of pixel areas disposed at a plurality of cross sections located where a plurality of anode electrode layers cross with a plurality of cathode electrode layers;
    a plurality of data lines disposed over a substrate and configured to electrically communicate with a corresponding plurality of anode electrode layers of the display area to provide data signals thereto;
    a plurality of scan lines disposed over the substrate and configured to electrically communicate with a corresponding plurality of cathode electrode layers of the display area to provide scan signals thereto; and
    a plurality of insulating layers disposed over the substrate and
        disposed to prevent both ends of top surfaces and side surfaces of a subset of the plurality of data lines from being exposed, or
        disposed to prevent both ends of a top surface and side surfaces of a subset of the plurality of scan lines from being exposed, or both.

5. The display panel of claim 4, wherein the light emitting display panel is an organic electroluminescent display panel.

6. The display panel of claim 4, wherein
    at least one data line comprises a transparent electrode line disposed over the substrate and a metal line disposed over the transparent electrode line, or
    at least one scan line comprises the transparent electrode line disposed over the substrate and the metal line disposed over the transparent electrode line, or
    both.

7. The display panel of claim 6,
    wherein the metal line is a first metal line,
    wherein the at least one data line further comprises a second metal line disposed over the first metal line and a third metal line disposed over the second metal line, or the at least one scan line further comprises the second metal line disposed over the first metal line and the third metal line disposed over the second metal line, or both, and wherein the second metal line is formed from a material from the first and third metal lines.

8. The display panel of claim 4, wherein a height of at least one insulating layer is at least as high as a height of a data line being covered by the at least one insulating layer, or a height of at least one insulating layer is at least as high as a height of a scan line being covered by the at least one insulating layer, or both.

* * * * *